United States Patent
Li et al.

(10) Patent No.: US 6,909,305 B1
(45) Date of Patent: Jun. 21, 2005

(54) DIGITALLY CONTROLLED IMPEDANCE DRIVER MATCHING FOR WIDE VOLTAGE SWINGS AT INPUT/OUTPUT NODE AND HAVING PROGRAMMABLE STEP SIZE

(75) Inventors: Zhongmin Li, Pocatello, ID (US); Troy Ruud, Pocatello, ID (US); Bryce Rasmussen, Pocatello, ID (US); Shan Mo, Pocatello, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 0 days.

(21) Appl. No.: 10/637,840

(22) Filed: Aug. 8, 2003

(51) Int. Cl.$^7$ .............................................. H03K 17/16
(52) U.S. Cl. ........................... 326/30; 326/86; 327/108
(58) Field of Search .............................. 326/21–27, 30, 326/86, 90; 327/108–112

(56) References Cited

U.S. PATENT DOCUMENTS

| | | | |
|---|---|---|---|
| 5,134,311 A | | 7/1992 | Biber et al. ................. 307/270 |
| 5,739,707 A | * | 4/1998 | Barraclough ................ 327/112 |
| 6,094,069 A | | 7/2000 | Magane et al. .............. 326/83 |
| 6,326,821 B1 | | 12/2001 | Gabara ....................... 327/112 |
| 6,445,245 B1 | | 9/2002 | Schultz et al. .............. 327/541 |
| 6,448,811 B1 | * | 9/2002 | Narendra et al. ............. 326/82 |
| 6,489,837 B2 | | 12/2002 | Schultz et al. .............. 327/541 |
| 6,600,347 B2 | * | 7/2003 | Borkenhagen et al. ...... 327/112 |
| 6,642,742 B1 | * | 11/2003 | Loyer .......................... 326/30 |
| 6,667,633 B2 | * | 12/2003 | Fifield et al. ................. 326/30 |

* cited by examiner

*Primary Examiner*—Vibol Tan
(74) *Attorney, Agent, or Firm*—Workman Nydegger

(57) ABSTRACT

A digitally controlled impedance driver circuit including a number of fingers, some of which having FETs and series resistors sized in binary or other differential ratios, and some of the higher power FETs being sized in equal ratio and perhaps sharing a series resistor. A DCI controller circuit periodically determines a configuration of the DCI driver circuit that would result in the DCI driver circuit approximating a target impedance. Each time the DCI controller circuit does this, a comparator determines if the impedance of the DCI driver circuit should be increased or decreased. A noise attenuation circuit turns off (or on) only one of the high power fingers if the controller circuit determines that more (or less) impedance is needed even if turning off (or on) only one of the fingers would not result in the configuration of the DCI driver circuit determined by the controller circuit.

24 Claims, 4 Drawing Sheets

DIGITALLY CONTROLLED IMPEDANCE DRIVER MATCHING FOR WIDE VOLTAGE SWINGS AT INPUT/OUTPUT NODE AND HAVING PROGRAMMABLE STEP SIZE

BACKGROUND OF THE INVENTION

1. The Field of the Invention

The present invention relates to a digitally controlled impedance driver that performs dynamic impedance matching for a wide range of voltage swings at the input/output node and that has a programmable step size.

2. Background and Related Art

Electronic circuits have revolutionized the way people work and play and have contributed enormously to the advancement of humankind. A large portion of the utility of electronic circuits is that they are designed to apply appropriately configured and timed signals to a load. A driver circuit is that portion of the circuit that physically applies the signal to the load. In order to reduce reflection and thereby improve the quality of the applied signal, the output impedance of the driver circuit should closely match the input impedance of the load.

Digitally Controlled Impedance (DCI) matching techniques are one class of techniques that may be used to provide some level of impedance matching. A "DCI driver" is a driver circuit that incorporates DCI matching techniques. FIG. 5 illustrates a conventional DCI driver 500 that includes multiple fingers 501(1) through 501(N). Each finger includes two Field Effect Transistors (FETs) including a p-type FET (pFET) coupled between the high voltage supply and the input/output node 502, and including an n-type FET (nFET) coupled between the low voltage supply and the input/output node.

As is known to those of ordinary skill in the art, a FET is a good resistor when operating in the linear region as when the voltage between drain and source is small, and when the gate-to-source voltage exceeds the threshold voltage of the FET. As the drain to source voltage increases beyond the over-drive voltage, the FET begins operating in the saturation region and thus is not a linear resistor any more. The output impedance looking into the input/output node 502 is composed of the paralleled impedance of each finger. It is this output impedance that is desired to be matched with the input impedance of the load (not shown) connected to input/output terminal 502. By adjusting the fingers that are turned on and off, the output impedance of the DCI driver circuit 500 may be adjusted until the output impedance looking into the DCI driver circuit 500 more closely matches the input impedance of the load.

However, the output impedance looking into the input/output node 502 is not constant during operation, but a function of a number of factors including the supply voltage, the process corner, the temperature, and the voltage applied at the input/output node 502. The supply voltage, the process corner, and the temperature may change over time, thereby often drifting the output impedance of the DCI driver 500 further from the input impedance of the load. Accordingly, a controller (not shown) is configured to periodically determine which of the fingers should be turned on, and which should be turned off, based on the existing circumstances, and then open or close the appropriate fingers. This typically results in the DCI driver output impedance being returned back closer to the load input impedance thereby preserving the quality of the signal generated by the DCI driver.

Conventional DCI controllers do well in adjusting the output impedance of the DCI driver to compensate for deviations due to supply voltage fluctuations, process corners, and temperature changes. Many conventional DCI driver circuits address the issue of fluctuations in DCI driver output impedance fluctuations due to variations in the applied voltage at the input/output node by matching impedance assuming that the applied voltage is at a certain level or vicinity. For example, to produce a DCI driver output impedance of fifty ohms, the DCI controller may assumes that a voltage halfway between the supply voltages is to be applied on the input/output node. To produce a DCI driver output impedance of twenty-five ohms, the DCI controller may assume that a voltage one third of the way from the low voltage supply to the high voltage supply is to be applied on the input/output node.

However, as the voltage applied at the input/output node transitions from the low voltage supply to the high voltage supply, the difference in the DCI driver output impedance may vary significantly. Some applied voltages may result in output impedances that are as high as double the output impedance resulting from other applied voltages. Accordingly, DCI controllers that determine which fingers of the DCI driver should be on or off by assuming a fixed applied voltage may improperly cause the DCI driver to have inaccurate output impedances.

FIG. 6 shows a conventional DCI driver 600 that uses fine and coarse FETs. All the fine FETs 601 are of the same size while the coarse FETs 602 (constituting pFETs 602A and nFETs 602b) have their length-to-width ratios sized in binary ratio. During the power-up phase, both the coarse FETs 602 and the fine-FETs 601 are turned on and off as appropriate to match a given impedance. After the power-up phase completes (i.e., in normal operation), the impedance is maintained by turning on and off as appropriate just the fine FETs 601, while disabling adjustment of the coarse FETs 602.

Maintaining impedance using fine FETs 601 requires a certain number of fine FETs configured in parallel to work with. Simulation shows that process corners alone can move finger impedance from its nominal value up by thirty-five percent and down by twenty-three percent while the variation of supply voltage and environmental temperature collectively can push the impedance up by forty percent and down by twenty-six percent from the nominal value. This data is obtained for a twenty-five ohm reference impedance assuming an applied voltage point match of 0.5 Volts and 1.5V supply. This means that as large as sixty-six percent variation may be observed in the impedance of each finger.

Accordingly, in order to maintain a matched impedance during normal operation using the DCI driver 600, there is a balance between having significant number of fine fingers for tuning and reducing the impedance of (i.e., making coarser) each fine finger to cover wider range. Having a significant number of fine fingers undesirably increases layout area and routing traffic. Reducing the impedance of each fine finger is undesirable because for a given accuracy, the fine FETs 601 should be as small as possible to have a certain high impedance. Therefore when the layout area and the routing channel is tight, it becomes very difficult or even impossible for conventional DCI drivers to keep the matched impedance over the entire supply voltage and temperature range.

Engaging coarse tuning during normal operation of drivers can be undesirable due to noise concern generated by SSO (Simultaneous Switching Output). In particular, due to inductive effects, switching coarse FETs 602 may degrade the signal provided on the input/output node.

Accordingly, what would be desirable is a DCI controller and driver that may quickly and accurately acquire a matched impedance during a power-up phase, and that may maintain the matched impedance during normal operation over the entire span of applied voltages at the input/output node, and without generating significant Simultaneous Switching Output noise at the input/output node.

BRIEF SUMMARY OF THE INVENTION

The principles of the present invention are directed towards a unique design for a Digitally Controlled Impedance driver circuit. The DCI driver circuit is configured to apply a signal on an input/output node, and includes a number of fingers. A p-type finger may include a p-type Field Effect Transistor (pFET) unit that is coupled between the high voltage supply and the input/output node via a series resistor. An n-type finger may include an n-type Field Effect Transistor (nFET) unit that is coupled between the low voltage supply and the input/output node via a series resistor. A FET unit may be a single FET or multiple FETs in parallel.

Some of the fingers are sized in binary ratio or some other differential configuration. In other words, the ideal effective length-to-width ratio based on the mask dimensions of a FET in one finger differs from the ideal effective length-to-width ratio of the FET in another finger. This would cause the actual effective length-to-width ratio to vary significantly from one FET in one finger to another FET in another finger. In binary configuration, the length-to-width ratios of the FETs are sized in approximate binary ratio. Whatever the ratio of the differential configuration, the associated series resistors are also appropriately sized according to the ratio of the differential configuration. Accordingly, the total impedance contribution of one finger is in proper proportion to the total impedance contribution from the other fingers, even if those impedances are not equal. Other of the FETs having the lowest length-to-width ratio are sized approximately equally to each other. These FETs may share the same resistor to thereby conserve layout area.

A DCI controller circuit periodically determines a configuration of the DCI driver circuit (i.e., which fingers should be turned on, and which should be turned off) that would result in the DCI driver circuit approximating a target impedance. Each time the DCI controller circuit does this, a comparator determines if the impedance of the DCI driver circuit should be increased or decreased.

A noise attenuation circuit turns off only one of the fingers if the controller circuit determines that more impedance is needed even if turning off only one of the fingers would not result in the configuration of the DCI driver circuit determined by the controller circuit. Likewise, the noise attenuation circuit turns on only one of the fingers if the controller circuit determines that less impedance is needed even if turning on only one of the fingers would not result in the configuration of the DCI driver circuit determined by the controller circuit. While it may take more configuration updates to reach the desired matched impedance, the noise introduced to the input/output node is reduced since only one finger is turned on or off for each configuration update.

In one embodiment, configuration updates occur more frequently during the power-up phase that during normal operation in which data may be present on the input/output node. This allows a matched impedance to be quickly obtained during power-up, even when only one finger is turned on or off per configuration update. Since there is no data present on the input/output node, the more frequent switching of the fingers does not adversely affect the data provided to the load since no data is provided during the power-up phase. Upon completion of the power-up phase, and upon entering normal operation, the configuration updates occur less frequently.

Less frequent updates during normal operation reduces the impact of switching noise on the input/output node. Furthermore, less frequent configuration updating may likely suffice so long as the frequency is still often enough that matched impedance may be generally maintained despite supply voltage fluctuations, process corners, temperature changes, and applied input/output voltage changes.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention are directed towards a Digitally Controlled Impedance (DCI) driver that is configured to drive a signal on its input/output node while at the same time controlling its own output impedance looking into the input/output node to closely match the input impedance of the load coupled to the input/output node. Such impedance matching greatly improves the quality of the signal that the DCI driver asserts on the input/output node.

Figure 1:
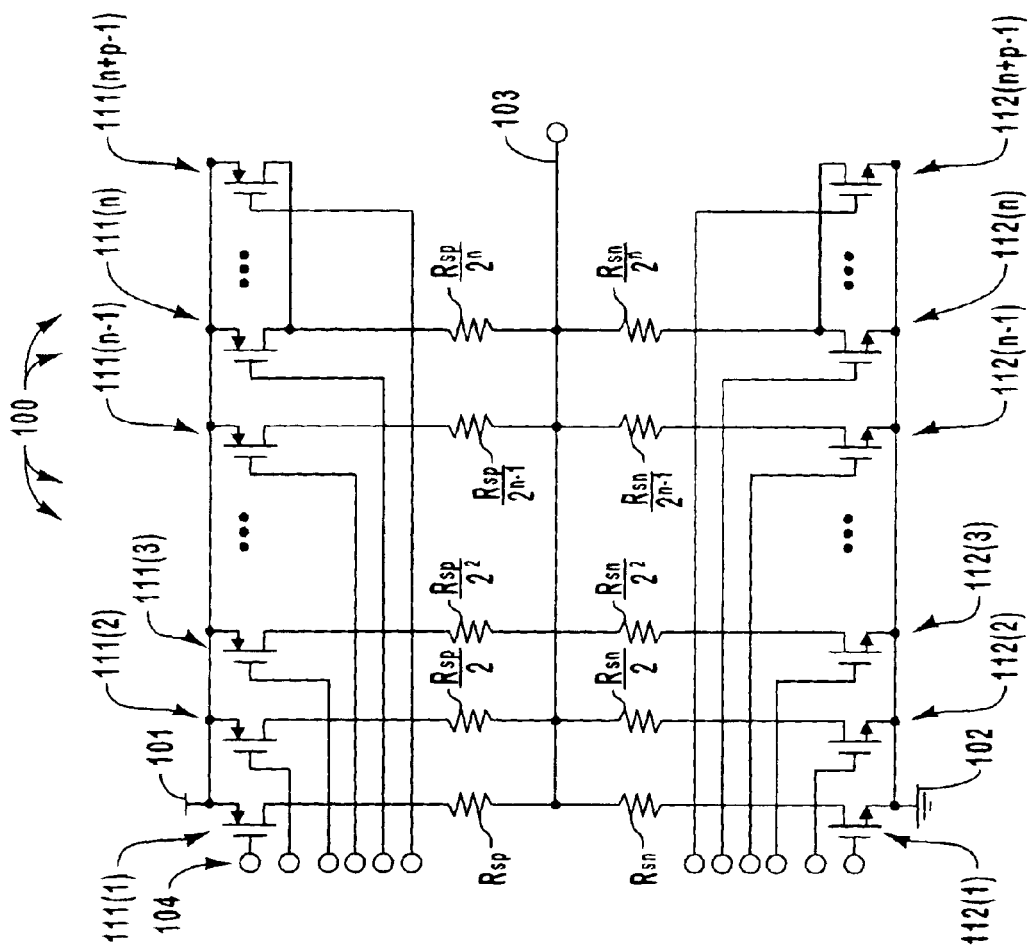
FIG. 1 illustrates a general embodiment of a DCI driver in accordance with the principles of the present invention.

FIG. 1 illustrates a DCI driver 100 in accordance with one embodiment of the present invention. The DCI driver 100 includes multiple fingers 111(1) through 111(n+p−1) and 112(1) through 112(n+p−1), where "n" and "p" are positive integers. The output impedance of the DCI driver 100 is controlled by configuring the multiple fingers so that the appropriate fingers are on and off to obtain the desired output impedance.

Each finger 111(1) through 111(n+p−1) includes a p-type Field Effect Transistor (pFET) unit as well as a resistor coupled in series between a high voltage supply 101 and the input/output node 103, and thus will hereinafter also be referred to as "p-type fingers". Each finger 112(1) through 112(n+p−1) includes an n-type Field Effect Transistor (nFET) unit as well as a resistor coupled in series between a low voltage supply 102 and the input/output node 103, and thus will hereinafter also be referred to as "n-type fingers". Although each FET unit is illustrated using symbols normally associated with a single FET, each FET unit may be a single FET or alternatively multiple FETs configured in parallel between the corresponding voltage supply and the corresponding resistor.

During operation, the output impedance may be adjusted by turning some of the fingers on and some of the fingers off. The DCI driver 100 includes multiple configuration input terminals 104 which (during operation) have voltages applied thereon that determine which of the fingers are turned on and which of the fingers are turned off. A finger is turned on when the corresponding FET is operating in the linear region and thus acting as much as a linear resistor, and is turned off when the corresponding FET is turned off. Each finger includes a combination of a resistor and an FET unit to extend the linear range of the FET unit. In other words, the FET unit will remain in the linear mode of operation for a larger range of voltages applied on the input/output terminal.

Some number "n" of the p-type fingers 111(1) through 111(n) are sized in binary configuration. Specifically, the ideal effective length-to-width ratio of the FET unit in p-type finger 111(2) is one half that of the ideal effective length-to-width ratio of the FET unit in p-type finger 111(1). Likewise the ideal effective length-to-width ratio of the FET unit in p-type finger 111(3) would be one half that of the ideal effective length-to-width ratio of the p-type FET unit in finger 111(2), and so on and so forth for all of the remaining p-type fingers 111(1) through 111(n). The same is true for the n-type fingers 112(1) through 112(n).

In this description and in the claims, the term "effective length-to-width ratio" (without being preceded by the modifier "ideal") and the term "actual effective length-to-width ratio" for a given FET unit is the length-to-width ratio of the channel region of the FET if the FET unit is a single FET. If the FET unit comprises multiple FETs, these same terms mean the length-to-width ratio of the channel region of a single FET that could replace the multiple FETs while preserving the same current-voltage characteristics as the multiple FETs viewed as a whole. In this description and in the claims, "ideal effective length-to-width ratio" for a given FET unit means what the effective length-to-width ratio of the FET would be if the FET features on the one or more masks used to construct the FET were perfectly transferred during construction of the FET.

The fingers 111(1) through 111(n) and 112(1) through 112(n) are also sized in binary configuration in the sense that the ideal resistance Rsp/2 of the resistor in p-type finger 111(2) is approximately one half of the ideal resistance Rsp of the resistor in p-type finger 111(1). Likewise, the ideal resistance Rsp/(2^2) of the resistor in p-type finger 111(3) is approximately one half of the ideal resistance Rsp/2 of the resistor in p-type finger 111(2), and so on and so forth for all of the p-type fingers 111(1) through 111(n). The same is true of the n-type fingers 112(1) through 112(n). In the description and in the claims, "ideal resistance" is the resistance that the resistor would have if the resistor patterns on the mask were perfectly transferred to the resistor during construction.

While some of the fingers 111(1) through 111(n) and 112(1) through 112(n) are sized in binary ratio as described herein, others of the p-type fingers 111(n) through 111(n+p−1) are approximately equally sized with each other, and n-type fingers 112(n) through 112(n+p−1) are approximately equally sized with each other. In other words, the ideal effective length-to-width ratios of the FETs in the p-type fingers 111(n) through 111(n+p−1) are approximately the same, wherein the ideal effective length-to-width ratios of the FETs in the n-type fingers 112(n) through 112(n+p−1) are likewise approximately the same. The fingers 111(n) through 111(n+p−1) and 112(n) through 112(n+p−1) may each have their own individual resistors coupled in series with the corresponding FET. However, in the illustrated embodiment, in order to conserve layout area, each finger 111(n) through 111(n+p−1) shares a common resistor having resistance Rsp/(2^n), while each finger 112(n) through 112(n+p−1) shares a common resistor having resistance Rsn/(2^n). Note that "p" in the terms 111(n+p−1) and 112(n+p−1) may have a value of one meaning that there are only fingers 111(1) through 111(n) and fingers 112(1) through 112(n).

In FIG. 1, if "p" is greater than one, a larger number of higher power fingers 111(n) through 111(n+p−1) are used instead of using a lesser number of even higher powered fingers that continue the binary configuration. Noise is reduced in the input/output node 103 by limiting the width-to-length ratio of the highest powered fingers and by limiting to one the number of highest powered fingers that are turned on or turned off during a configuration update. In addition, the configuration updates may occur more frequently during the power-up phase than during normal operation when data is actually being provided on the input/output node.

As will be apparent to those of ordinary skill in the art after having reviewed this description, although fingers 111(1) through 111(n) and 112(1) through 112(n) are described herein as being sized in binary configuration (having a base of two), they may also be sized using any other base. For example, the fingers 111(1) through 111(n) and 112(1) through 112(n) may be sized in the decimal configuration (having a base of ten), or any other base such as base-three, base-four or the like. The base need not even be an integer. For example, one FET may have an ideal effective length-to-width ratio that is one over the square root of two times the ideal effective length-to-width ratio of the next FET thereby forming a base of the square root of two. The base need not even be constant across all of the fingers 111(1) through 111(n) and 112(1) through 112(n). For example, some of the fingers may be sized in binary configuration while others are in decimal configuration.

Accordingly, there are a wide variety of configurations that may be possible for a DCI driver circuit in accordance with the principles of the present invention. Generalizing FIG. 1 for a moment, the principles of the present invention may be extended to any array of fingers in which the ideal effective length-to-width ratio of the FET unit and the ideal resistance of the resistor in one finger is smaller than the respective ideal effective length-to-width ratio of the FET unit and the ideal resistance of the resistor in another finger. Generalizing in a different way, the principles of the present invention may be extended to any array of fingers in which the actual effective length-to-width ratio of the FET unit in one finger differs significantly from (e.g., is sixty percent or less of) the actual effective length-to-width ratio of the FET unit in another finger in a manner that may not be explained by simple imperfections in patterning fingers intended to be of equal size.

In addition, though the length-to-width ratios of the FETs and the resistance of the resistors in any given finger are described as being proportional, it is impossible to perfectly transfer a pattern from a mask to a semiconductor substrate. In addition, designers may vary intentionally from perfect proportionality between the FET and the resistor in the same finger, while still retaining much of the benefit of the principles of the present invention. Accordingly, the principles of the present invention do not require perfect proportionality between a resistor and a FET unit in any given finger. However, having proportionality between the series resistance and the resistance of the FET operating in the linear region, allows the overall resistance of the finger to be proportional as compared to neighboring fingers. This enables more precise control over impedance matching.

Having described the structure of the specific embodiment illustrated in FIG. 1 along with associated generalizations of the embodiment, the operation of the DCI driver 100 will now be described. Assume $R_{on}$ stands for the resistance of an FET unit operating in the linear region, the FET unit corresponding to the left-most p-type finger or n-type finger is on. The series resistance $R_s$ of the left-most finger ($R_{sp}$ if the resistor is part of a p-type finger or $R_{sn}$ if the resistor is part of the left-most n-type finger) has resistance valued X times larger than $R_{on}$. If the FET drain voltage when the FET goes into saturation is denoted as $V_{dsat}$, then by adding the series resistor having resistance $R_s$, the linear range of the impedance presented at the input/output node 103 is extended to $(1+X)*V_{dsat}$, an increase of X times. The higher the series resistance, the greater the linearity in the impedance matching. However, the higher the series resistance, the greater the layout area occupied by the series resistor. Accordingly, the determination of an appropriate size for the resistor involves a trade-off between linearity of matched impedance and layout size.

Even after the fingers are initially configured, the output impedance may still wander due to supply voltage fluctuations, temperature variations, and applied input/output node voltage changes. In order to maintain the output impedance at its proper value matched closely with the input impedance of the load, a DCI controller determines a new configuration for the fingers. The DCI controller provides this configuration updated information to the DCI driver. Then the DCI driver uses the updated configuration information to adjust which fingers are on and off to thereby return the output impedance of the DCI driver closer back towards the input impedance of the load.

Figure 2:
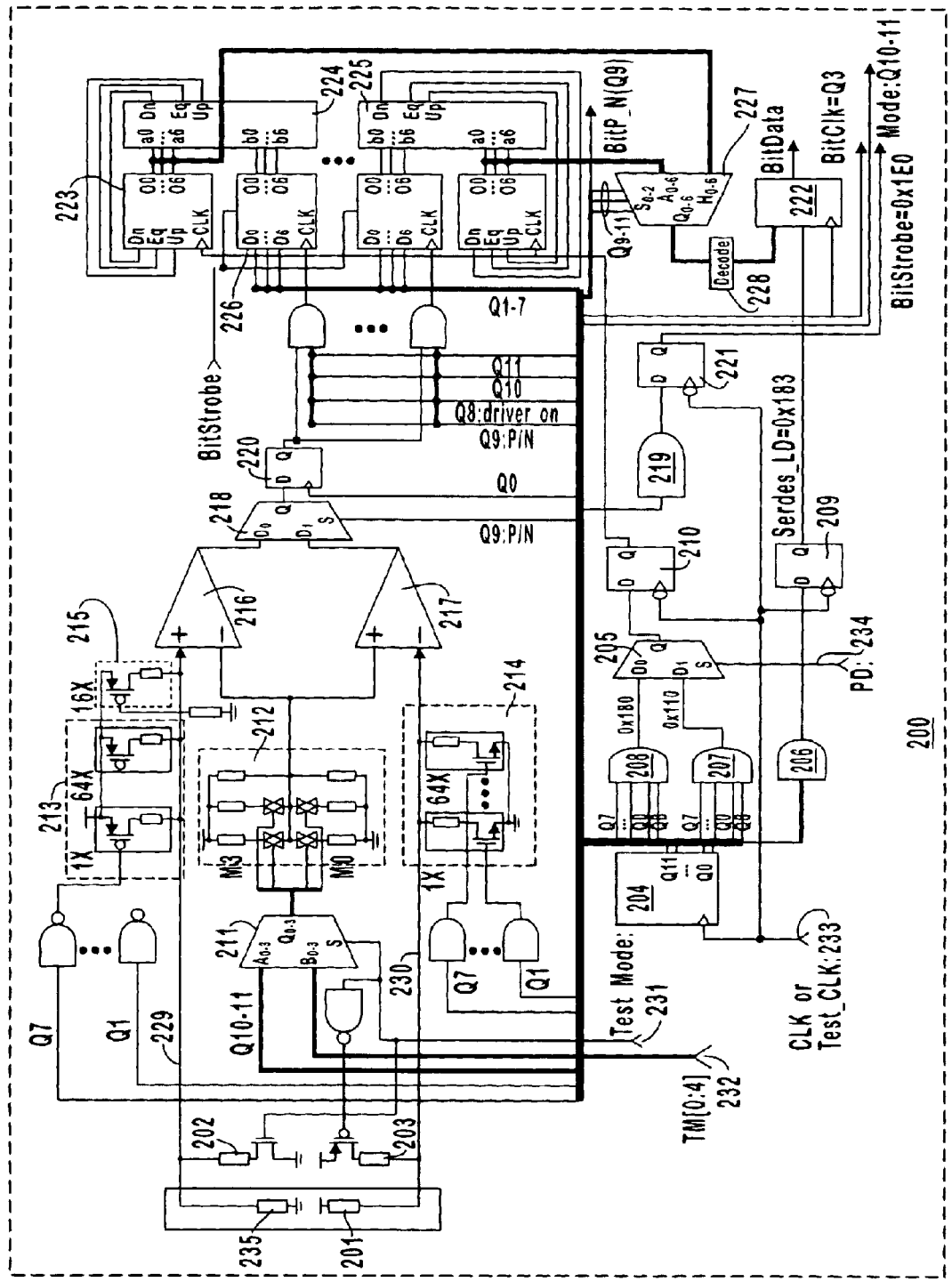
FIG. 2 illustrates a specific embodiment of a DCI controller in accordance with the principles of the present invention.

FIG. 2 shows an embodiment of a DCI controller 200 in accordance with the principles of the present invention. The DCI controller 200 operates to properly provide configuration information to the DCI driver 300 of FIG. 3 so that the output impedance of the DCI driver 300 appropriately turns on or off appropriate fingers to have the DCI driver 300 more closely match a certain predetermined impedance. The DCI controller 200 operates in a normal operation and test mode. Each mode includes a power-up phase and a normal operation phase after the power-up phase.

In normal operation mode, counter 204 is driven by a clock signal 233 either generated internally during the normal operation mode, or driver by a test clock signal in the test mode. In either normal operation or test mode, counter 204 generates data Q[0–11]. The data Q[11–0], when read from the most significant bit Q[11] to the least significant bit Q[0], are a binary representation of the value counted by counter 204.

The least significant bit Q[0] is used to lock data into D-flip flop 220 after all switching activities of 213 and 214 complete (described further below) and the outputs of comparators 216 and 217 stabilize. This normally also imposes an upper limit on the speed clock signal 233 can run. Bits Q[1–7] are buffered to drive an array of binary ratioed nFETs 214, whereas the same signals are inverted then buffered to drive an array of binary ratioed pFET 213. Both FET arrays are constructed in such way that each finger is a FET in series with a resistor to give a suitable trade-off between layout size and linearity of matched impedance.

Two external reference resistors 235 and 201 are connected to the positive and negative inputs of an analog comparator 216 and 217 respectively. In test mode, resistors 235 and 201 are both disconnected from the circuit, and the on-chip resistors 202 and 203 are switched in to take over the functions that 235 and 201 assume during normal operations mode. The extra p-type finger 215 introduces a starting point for the impedance matching and is always on for the range of impedance intended to match. Although not shown, an extra n-type finger may be configured to the n-type bank of fingers 214 in a similar manner that the extra p-type finger 215 is configured for the p-type bank of fingers 213.

Every Q[8] cycle, a complete set of configuration data is sampled and delivered by DCI controller 200 to DCI driver 300, whether due to an initial configuration, or due to a configuration update. The signal "BitStrobe" in FIGS. 2 and 3 indicates the moment delivery of the configuration data completes. The most significant three bits of Q[11–0] are used to indicate types of the data. For example, bit Q[9] signifies if the data sampled and delivered are for n-side FET units 307 or for p-side FETs 306 of FIG. 3. Bits Q[10 –11] signify for what type of DCI driver the data is sampled and delivered. There can be four different type DCI drivers according to this embodiment as indicated by the two input bits Q10–11 to decoder 210 in FIG. 2. For example, one type of DCI driver may be configured to match 25 ohms, another 50 ohms, another 75 ohms and yet another 100 ohms. Additional driver types are possible and can be realized by increasing the total bits of counter 104. Accordingly, the DCI controller 200 and driver 300 might only be active when the bits that are more significant that bit Q[9] have specific values.

When Q[8] is low, the DCI controller 200 is in sampling phase during which the configuration data for the DCI driver 300 is calculated for one of the pFET units 306 when the bit Q[9] has a high value or nFET units 307 when the bit Q[9] has a low value. In either case, the sampling phase starts with all the bits Q[1–7] being low. All the pFET units in bank 213 and the nFET units in bank 214 are thereby turned off because all the gate terminals of the nFET units are low and all the gate terminals of the pFET units are high. At this stage, when sampling for the pFET units, the node 229 is pulled-down low by external resistance 235 (during normal operation mode) or on-chip resistance 202 (during test mode). When sampling for the nFET units, the node 230 is pulled-up high by external resistance 20 (during normal operation mode) or on-chip resistance 203 (during test mode). The outputs of both comparator 216 or 217 are low at this moment.

When in the sampling phase for the pFET units, the output of comparator 216 does not switch to high until there are sufficient pFET units 213 turned on. As the seven-bits Q[1–7], denoted in a binary format, increases its nominal value, more and more fingers in FET array 213 are turned on. The potential on node 229 goes higher and higher. By the time that node 229 is higher than a potential set by reference voltage generator 212, the comparator 216 makes an output transition from low to high.

When in the sampling phase for the nFET units, the output of comparator 217 does not switch to high until there are sufficient nFET units 214 turned on. In that case, as the seven bits Q[1–7] increases in value, more and more fingers in FET array 214 are turned on. The potential on node 230 goes lower and lower. By the time that node 230 is lower than the potential set by reference voltage generator 212, the comparator 217 makes an output transition from low to high.

A transition to high from the output of comparator 216 or 217 is latched-up into register 220 at the next rising edge of bit Q[0], which generates a high-going edge at the clock input of a D-type flip-flop 226. This causes the values of bits Q[1–7] at the time when the output of comparator 216 or 217 switched to high to be written into the D flip-flops 226.

To provide fail-safe protection for cases when the temperature/process/voltage is outside the designed range or the reference resistance is outside the design range, or the triggering pulse from the comparator is not generated at all for some reason such as noise, D flip-flop 226 are loaded all high at the beginning of each sample cycle and cleared to all low at the beginning of delivery cycle (when bit Q[8] is high as described further below) if the output of comparator 216 or 217 stays low.

DCI controller 200 stores configured data in an up/down counter 223. The digital comparator 224 then compares the data in counter 223 with the outputs of D flip-flop 226. The digital comparator 224 outputs signals to indicate whether or not the stored configuration is equal to, less or greater than the latest sampled data bits Q[1–7]. An equal indicates the stored information is up-to-date. A "greater" or "less" result indicates the stored information is outdated. Therefore, the outputs of digital comparator 224 instruct up/down counter 223 to count upwards, downwards or stay where it is. In this manner, the counter 223 increments or decrements incrementally towards the proper configuration represented by the value of bits Q[1–7] provided to the counter 223 when the comparator makes the transition to high. This is as opposed to immediately transitioning the configuration data to the current value of bits Q[1–7]. This incremental treatment ensures that no more than one high power finger in the DCI driver 300 is turned off or on during configuration update. Accordingly, the switch noise introduced into the input/output node of the DCI driver 300 is reduced.

During the power-up phases, the stored configuration is compared with the sampled data and updated 128 times per Q[8] cycle. Update at such a high frequency ensures that data sent out to DCI driver 200 when the power-up phase is completed, even when the configuration updates occur incrementally towards the correct configuration values, rather than instantly jumping to the correct configuration values that would result in the desired output impedance. After the power-up phase, under normal operation, data in the up/down counter 223 is updated only once per Q[8] cycle. This means that the increment or decrement is kept to a minimum size during each update to D flip-flop 302 and 303. By having decoder 208 and 207 coded in various way, updating at variable step size to the configuration data stored in up/down counter 223 is realized.

FIG. 2 shows the decoder 208 configured as 0x180. In this way, only one update happens every Q[8] cycle for normal operation. The decoder 207 is configured as 0b1,xxx1,0000, which allows 6 updates every Q[8] cycle before the data is sent out when the signal Serdes_LD becomes equal to 0x183. Here "x" stands for unset or "don't care" bit. For 128 updates per Q8 cycle, decoder 207 can be configured as 0b1,xxxx,xxx1. The width of the updating signal for the up/down counter 223 is determined by how many less significant bits there are to the right of the first bit set.

To reduce the switching noise introduced into the input/output node of the DCI driver 300 during normal operation, the DCI controller 200 does not send configuration data to the DCI driver 300 or store the configuration data in D flip-flops 223 until the decoder 228 translates the data into a format of driving strength no more than 16X. To accomplish this, the seven binary bits corresponding to powers 1X/2X/4X/8X/16X/32X/64X format are translated into 11 bit data in format of 1X/2X/4X/8X/16X, where there may be 7 instances of the 16X power. The 11 bit configuration data may then be used to turn on or off the appropriate fingers of the DCI driver 300. To reduce the bus traffic, the parallel configuration data is converted into serial data and back to parallel through parallel-to-serial converted 222 of FIG. 2 and serial-to-parallel converter 308 of FIG. 3.

Figure 3:
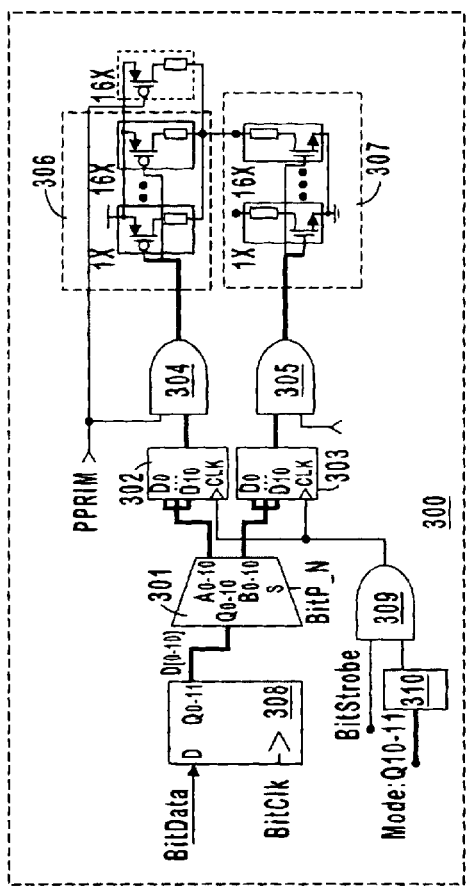
FIG. 3 illustrates a specific embodiment of a DCI driver in accordance with the principles of the present invention.

Referring to FIG. 3, the p-side driver 306 and the n-side driver 307 are each structured with 11 fingers in parallel. The p-side driver 306 and the n-side driver 307 combined are comparable to the DCI driver 100 of FIG. 1 where there are five fingers in binary configuration, and seven fingers of equal size. Specifically, for each of the p-side driver 306 and the n-side driver 307, there is one finger for each of strength 1X, 2X, 4X and 8X, and seven fingers for 16X strength level. Not all of the fingers are shown, but are at least symbolically represented using horizontal ellipses. The 11-bits of DCI configuration data provided by the DCI controller 200 each control a gate terminal of a corresponding FET unit in an appropriate finger of the DCI driver 300.

If there is no skew among the bits of configuration data sent out by AND gates 304 or 305, Simultaneous Switching Output (SSO) should not be a significant issue if only one of the high power fingers is switched per configuration update. As illustrated before, the control mechanism ensures that after power-up, the 11-bit configuration data is stepped up or down in a controlled size which can be as small as 1X as coded in the decoder 207. D Flip-flop 302 and 303 as well as AND gates 304 and 305 are preferably placed close or next to the gates of p-side driver 306 and n-side driver 307 respectively, to thereby reduce the skew among the bits of configuration data. Even if there is skew, the impact of the skew is significantly reduced by removing the replacing maximum strength 64X and 32X fingers with a higher number of 16X fingers.

Proper functioning of the DCI controller 200 and DCI driver 300 is testable with use of multiplexer 211 and reference voltage network 212. The 4-bits outputs of multiplexer 211 controls four transmission gates to thereby changes the reference voltage to five possible discrete values. Those 5 discrete reference voltages are used for DCI driver to match 5 discrete impedances, i.e., 25 ohm, 50 ohm, 75 ohm, 100 ohm and 114 ohm respectively. In normal operation, each DCI driver is configured to match specific impedance only. In test mode, the driver is tested to match all the 5 discrete impedance as listed above to demonstrate the proper function of DCI control logic.

Figure 4:
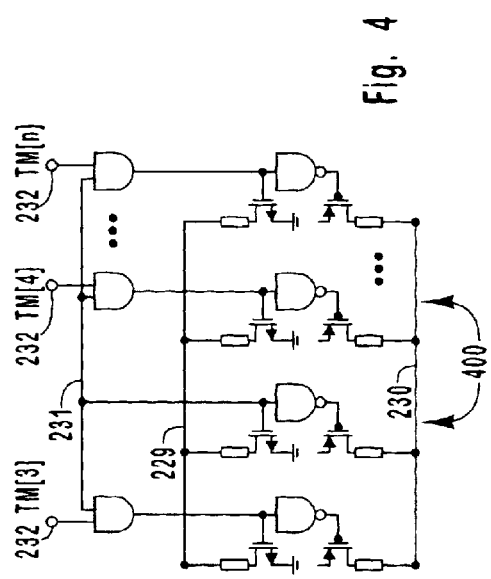
FIG. 4 illustrates a reference impedance network that may be used with the DCI controller illustrated in FIG. 2.
Figure 6:
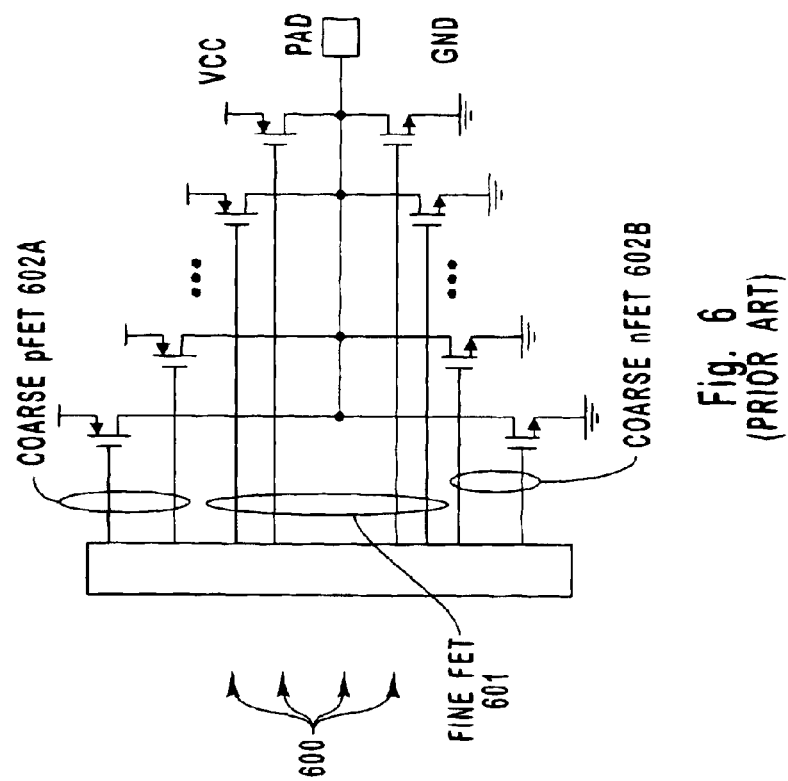
FIG. 6 illustrates a DCI driver in accordance with the prior art in which impedance matching is accomplished using coarse and fine fingers.
Figure 5:
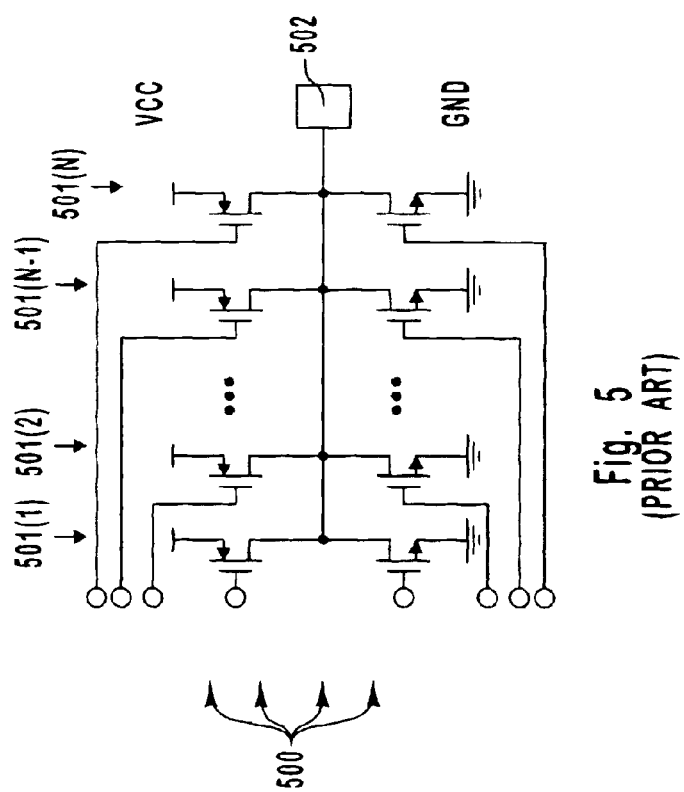
FIG. 5 illustrates a DCI driver in accordance with the prior art in which impedance matching is accomplished using parallel fingers.

The specification that DCI driver 300 matches within +−10% tolerance is testable using an impedance network shown in FIG. 4 to replace on-chip resistors 202 and 203. In test mode, bits TM[3-n] and test-mode signal 231 move impedance seen on node 229 and 230 by +−10% from their nominal values and thus emulate changes in reference resistors 235 and 201. There should be corresponding +−10% percent driving strength movement tested on the DCI driver.

Across process corner test is made possible by varying impedance seen on node 229 and 230 more pronounced from their nominal value. Instead of changing the impedance of FETs by +35% or −23% from their nominal values with process corner, a same amount of percentage of change is imposed on the impedance of node 229 and 230 by controlling bits TM[3-n] and signal 231. For different process, the percentage number actually used can be based upon the simulation data across corners.

Accordingly, a digitally controlled impedance driver circuit has been described that includes a number of fingers, some of which having FETs and series resistors sized in binary or other differential ratios, and some of the higher power FETs being sized in equal ratio and perhaps sharing a series resistor. A DCI controller circuit periodically determines a configuration of the DCI driver circuit that would result in the DCI driver circuit approximating a target impedance. Each time the DCI controller circuit does this, a comparator determines if the impedance of the DCI driver circuit should be increased or decreased. A noise attenuation circuit turns off (or on) only one of the high power fingers if the controller circuit determines that more (or less) impedance is needed even if turning off (or on) only one of the fingers would not result in the configuration of the DCI driver circuit determined by the controller circuit.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A digitally controlled impedance driver circuit in comprising the following:

a first voltage supply that is configured to carry a first voltage during operation;

an input/output node upon which the digital controlled impedance driver circuit is to apply a signal during operation;

a first finger comprising a first field effect transistor unit having a first ideal effective length-to-width ratio and having a source terminal coupled to the first voltage supply, and further comprising a first resistor coupled in series between a drain terminal of the first field effect transistor unit and the input/output node, the first resistor having a first ideal resistance;

a second finger comprising a second field effect transistor unit having a second ideal effective length-to-width ratio and having a source terminal coupled to the first voltage supply, wherein the second ideal effective length-to-width ratio is smaller than the first ideal effective length-to-width ratio, the second finger further including a second resistor coupled in series between a drain terminal of the second field effect transistor unit and the input/output node, the second resistor having a second ideal resistance that is smaller than the first ideal resistance, wherein the ratio of the second ideal effective length-to-width ratio to the first ideal effective length-to-width ratio is between forty percent and sixty percent; and a third finger comprising a third field effect transistor unit having a third ideal effective length-to-width ratio and having a source terminal coupled to the first voltage supply, wherein the third ideal effective length-to-width ratio is ninety to one hundred and ten percent of the second ideal effective length-to-width ratio, wherein the third finger further includes a third resistor coupled in series between a drain terminal of the third field effect transistor unit and the input/output node, the third resistor having a third ideal resistance that is ninety to one hundred and ten percent of the second ideal resistance.

2. A digitally controlled impedance driver circuit in accordance with claim 1, wherein the second transistors couples a drain terminal of the third field effect transistor unit to the input/output node.

3. A digitally controlled impedance driver circuit in accordance with claim 1, wherein the ratio of the third ideal effective length-to-width ratio to the second ideal effective length-to-width ratio is one.

4. A digitally controlled impedance driver circuit in comprising the following:

a first voltage supply that is configured to carry a first voltage during operation;

an input/output node upon which the digital controlled impedance driver circuit is to apply a signal during operation;

a first finger comprising a first field effect transistor unit having a first ideal effective length-to-width ratio and having a source terminal coupled to the first voltage supply, and further comprising a first resistor coupled in series between a drain terminal of the first field effect transistor unit and the input/output node, width the first resistor having a first ideal resistance, and a second finger comprising a second field effect transistor unit having a second ideal effective length-to-width ratio and having a source terminal coupled to the first voltage supply, wherein the second ideal effective length-to-width ratio is smaller than the first ideal effective length-to-width ratio, the second finger further including a second resistor coupled in series between a drain terminal of the second field effect transistor unit and the input/output node, the second resistor having a second ideal resistance that is smaller than the first ideal resistance, wherein the ratio of the second ideal effective length-to-width ratio to the first ideal effective length-to-width ratio is below forty percent.

5. A digitally controlled impedance driver circuit in accordance with claim 4, further comprising the following:

a third finger comprising a third field effect transistor unit having a third ideal effective length-to-width ratio and having a source terminal coupled to the first voltage supply, wherein the third ideal effective length-to-width ratio is ninety to one hundred and ten percent of the second ideal effective length-to-width ratio.

6. A digitally controlled impedance driver circuit in accordance with claim 5, wherein the third finger further includes a third resistor coupled in series between a drain terminal of the third field effect transistor unit and the input/output node.

7. A digitally controlled impedance driver circuit in accordance with claim 5, wherein the second transistors couples a drain terminal of the third field effect transistor unit to the input/output node.

8. A digitally controlled impedance driver circuit in accordance with claim 5, wherein the ratio of the third ideal effective length-to-width ratio to the second ideal effective length-to-width ratio is one.

9. A digitally controlled impedance driver circuit further comprising the following:
   a first voltage supply that is configured to carry a first voltage during operation;
   an input/output node upon which the digital controlled impedance driver circuit is to apply a signal during operation;
   a first finger comprising a first field effect transistor unit having a first ideal effective length-to-width ratio and having a source terminal coupled to the first voltage supply and further comprising a first resistor coupled in series between a drain terminal of the first field effect transistor unit and the input/output node, the first resistor having a first ideal resistance; and
   a second finger comprising a second field effect transistor unit having a second ideal effective length-to-width ratio and having a source terminal coupled to the first voltage supply wherein the second ideal effective length-to-width ratio is smaller than the first ideal effective length-to-width ratio, the second finger further including a second resistor coupled in series between a drain terminal of the second field effect transistor unit and the input/output node, the second resistor having a second ideal resistance that is smaller than the first ideal resistance; and
   a third finger comprising a third field effect transistor unit having a third ideal effective length-to-width ratio and having a source terminal coupled to the first voltage supply, wherein the third ideal effective length-to-width ratio is ninety to one hundred and ten percent of the second ideal effective length-to-width ratio.

10. A digitally controlled impedance driver circuit in accordance with claim 9, wherein the third finger further includes a third resistor coupled in series between a drain terminal of the third field effect transistor unit and the input/output node.

11. A digitally controlled impedance driver circuit in accordance with claim 9, wherein the second transistors couples a drain terminal of the third field effect transistor unit to the input/output node.

12. A digitally controlled impedance driver circuit in accordance with claim 9, wherein the ratio of the third ideal effective length-to-width ratio to the second ideal effective length-to-width ratio is one.

13. A digitally controlled impedance driver circuit in comprising the following:
   a first voltage supply that is configured to carry a first voltage during operation;
   an input/output node upon which the digital controlled impedance driver circuit is to apply a signal during operation;
   a first finger comprising a first field effect transistor unit having a first ideal effective length-to-width ratio and having a source terminal coupled to the first voltage supply, and further comprising a first resistor coupled in series between a drain terminal of the first field effect transistor unit and the input/output node, the first resistor having a first ideal resistance; and
   a second finger comprising a second field effect transistor unit having a second ideal effective length-to-width ratio and having a source terminal coupled to the first voltage supply, wherein the second ideal effective length-to-width ratio is smaller than the first ideal effective length-to-width ratio, the second finger further including a second resistor coupled in series between a drain terminal of the second field effect transistor unit and the input/output node, the second resistor having a second ideal resistance that is smaller than the first ideal resistance, wherein the digitally controlled impedance driver circuit comprises at least third, fourth, and fifth fingers, each having approximately the same impedance when turned on as the second finger, the digitally controlled impedance driver circuit further comprising the following:
   a controller circuit configured during operation to periodically determine a configuration of the digitally controlled impedance driver circuit that would result in the digitally controlled impedance driver circuit approximating a target impedance;
   a comparator configured to determine if the impedance of the digitally controlled impedance driver circuit should be increased or decreased; and
   a noise attenuation circuit configured to turn off only one of the second, third, fourth or fifth fingers if the controller circuit determines that more impedance is needed even if turning off only one would not result in the configuration of the digitally controlled impedance driver circuit determined by the controller circuit.

14. A digitally controlled impedance driver circuit in accordance with claim 13, wherein the noise attenuation circuit is further configured to turn on only one of the second, third, fourth or fifth fingers if the controller circuit determines that less impedance is needed even if turning on only one would not result in the configuration of the digitally controlled impedance driver circuit determined by the controller circuit.

15. A digitally controlled impedance driver circuit in accordance with claim 13, wherein the controller circuit is configured to periodically make the determination of the configuration more frequently during power-up than when the digitally controlled impedance driver circuit is actually driving data to a load, and wherein the noise attenuation circuit is configured to adjust the configuration of the digitally controlled impedance driver circuit more frequently during power-up than when the digitally controlled impedance driver circuit is actually driving data to the load.

16. A digitally controlled impedance driver circuit comprising the following:
   a first voltage supply that is configured to carry a first voltage during operation;
   an input/output node upon which the digital controlled impedance driver circuit is to apply a signal during operation;
   a first finger comprising a first field effect transistor unit having a first effective length-to-width ratio and having a source terminal coupled to the first voltage supply, and further comprising a first resistor coupled in series between a drain terminal of the first field effect transistor unit and the input/output node, the first resistor having a first resistance;
   a second finger comprising a second field effect transistor unit having a second effective length-to-width ratio and having a source terminal coupled to the first voltage supply, the second finger further including a second resistor coupled in series between a drain terminal of the second field effect transistor unit and the input/output node, the second resistor having a second resistance, wherein the ratio of the second effective length-to-width ratio to the first effective length-to-width ratio is less than sixty percent; and a third finger comprising a third field effect transistor unit having a third effective length-to-width ratio and having a source terminal coupled to the first voltage supply, wherein the third effective length-to-width ratio is ninety to one hundred and ten percent of the second effective length-to-width ratio.

17. A digitally controlled impedance driver circuit in accordance with claim 16, wherein the third finger further includes a third resistor coupled in series between a drain terminal of the third field effect transistor unit and the input/output node.

18. A digitally controlled impedance driver circuit in accordance with claim 16, wherein the second transistors couples a drain terminal of the third field effect transistor unit to the input/output node.

19. A digitally controlled impedance driver circuit comprising the following:

a first voltage supply that is configured to carry a first voltage during operation;

an input/output node upon which the digital controlled impedance driver circuit is to apply a signal during operation;

a first finger comprising a first field effect transistor unit having a first effective length-to-width ratio and having a source terminal coupled to the first voltage supply, and further comprising a first resistor coupled in series between a drain terminal of the first field effect transistor unit and the input/output node, the first resistor having a first resistance;

a second finger comprising a second field effect transistor unit having a second effective length-to-width ratio and having a source terminal coupled to the first voltage supply, the second finger further including a second resistor coupled in series between a drain terminal of the second field effect transistor unit and the input/output node, the second resistor having a second resistance, wherein the ratio of the second effective length-to-width ratio to the first effective length-to-width ratio is less than sixty percent, wherein the digitally controlled impedance driver circuit comprises at least third, fourth, and fifth fingers, each having approximately the same impedance when turned on as the second finger, the digitally controlled impedance driver circuit further comprising the following:

a controller circuit configured during operation to periodically determine a configuration of the digitally controlled impedance driver circuit that would result in the digitally controlled impedance driver circuit approximating a target impedance;

a comparator configured to determine if the impedance of the digitally controlled impedance driver circuit should be increased or decreased; and a noise attenuation circuit configured to turn off only one of the second, third, fourth or fifth fingers if the controller circuit determines that more impedance is needed even if turning off only one would not result in the configuration of the digitally controlled impedance driver circuit determined by the controller circuit.

20. A digitally controlled impedance driver circuit in accordance with claim 19, wherein the noise attenuation circuit is further configured to turn on only one of the second, third, fourth or fifth fingers if the controller circuit determines that less impedance is needed even if turning on only one would not result in the configuration of the digitally controlled impedance driver circuit determined by the controller circuit.

21. A digitally controlled impedance driver circuit in accordance with claim 19, wherein the controller circuit is configured to periodically make the determination of the configuration more frequently during power-up than when the digitally controlled impedance driver circuit is actually driving data to a load, and wherein the noise attenuation circuit is configured to adjust the configuration of the digitally controlled impedance driver circuit more frequently during power-up than when the digitally controlled impedance driver circuit is actually driving data to the load.

22. A digitally controlled impedance driver circuit comprising the following:

a first voltage supply that is configured to carry a first voltage during operation;

an input/output node upon which the digital controlled impedance driver circuit is to apply a signal during operation;

an array of fingers, each finger comprising a field effect transistor unit that is coupled between the first voltage supply and the input/output node, the field effect transistor units configured to operate in the linear region when the corresponding finger is on, and to be turned off when the finger is off;

a controller circuit configured during operation to periodically determine a configuration of the digitally controlled impedance driver circuit that would result in the digitally controlled impedance driver circuit approximating a target impedance;

a comparator configured to determine if the impedance of the digitally controlled impedance driver circuit should be increased or decreased; and a noise attenuation circuit configured to turn off only one of the fingers if the controller circuit determines that more impedance is needed even if turning off only one finger would not result in the configuration of the digitally controlled impedance driver circuit determined by the controller circuit.

23. A digitally controlled impedance driver circuit in accordance with claim 22, wherein the noise attenuation circuit is further configured to turn on only one of the second fingers if the controller circuit determines that less impedance is needed even if turning on only one would not result in the configuration of the digitally controlled impedance driver circuit determined by the controller circuit.

24. A digitally controlled impedance driver circuit in accordance with claim 22, wherein the controller circuit is configured to periodically make the determination of the configuration more frequently during power-up than when the digitally controlled impedance driver circuit is actually driving data to a load, and wherein the noise attenuation circuit is configured to adjust the configuration of the digitally controlled impedance driver circuit more frequently during power-up than when the digitally controlled impedance driver circuit is actually driving data to the load.

* * * * *

UNITED STATES PATENT AND TRADEMARK OFFICE
CERTIFICATE OF CORRECTION

PATENT NO. : 6,909,305 B1
DATED : June 21, 2005
INVENTOR(S) : Li et al.

It is certified that error appears in the above-identified patent and that said Letters Patent is hereby corrected as shown below:

Column 2,
Line 8, change "assumes" to -- assume --.
Line 50, before "significant" insert -- a --.
Line 52, before "wider" insert -- a --.

Column 3,
Line 62, after "power-up phase" change "that" to -- than --.

Column 8,
Line 13, after "in such" insert -- a --.
Line 47, after "significant" change "that" to -- than --.

Column 9,
Line 26, change "flip-flop" to -- flip-flops --.
Line 63, change "way," to -- ways, --.

Column 11,
Line 14, change "process," to -- processes, --.

Column 12,
Line 36, after "input/output node," remove "width".

Signed and Sealed this

Twenty-second Day of November, 2005

JON W. DUDAS
*Director of the United States Patent and Trademark Office*